(12) United States Patent
Radu et al.

(10) Patent No.: US 8,487,055 B2
(45) Date of Patent: Jul. 16, 2013

(54) HOLE TRANSPORT POLYMERS

(75) Inventors: Nora Sabina Radu, Landenberg, PA (US); Gene M. Rossi, Wilmington, DE (US); Eric Maurice Smith, Hockessin, DE (US); Yulong Shen, Wilmington, DE (US); Weiying Gao, Landenberg, PA (US); Reid John Chesterfield, Santa Barbara, CA (US); Jeffrey A. Merlo, Wilmington, DE (US); Daniel David Lecloux, Midland, MI (US); Frederick P. Gentry, Bear, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/310,886

(22) Filed: Dec. 5, 2011

(65) Prior Publication Data
US 2012/0077955 A1    Mar. 29, 2012

Related U.S. Application Data

(62) Division of application No. 11/843,029, filed on Aug. 22, 2007.

(60) Provisional application No. 60/839,915, filed on Aug. 24, 2006.

(51) Int. Cl.
*C08F 12/20* (2006.01)
*C08F 12/00* (2006.01)

(52) U.S. Cl.
USPC ............................ 526/242; 526/280; 528/422

(58) Field of Classification Search
USPC .................................. 526/242, 280; 528/422
See application file for complete search history.

(56) References Cited

U.S. PATENT DOCUMENTS

| | | |
|---|---|---|
| 5,707,747 A | 1/1998 | Tomiyama et al. |
| 5,929,194 A | 7/1999 | Woo et al. |
| 5,962,631 A | 10/1999 | Woo et al. |
| 6,259,202 B1 | 7/2001 | Sturm et al. |
| 6,872,475 B2 | 3/2005 | Chen et al. |
| 6,953,705 B2 | 10/2005 | Prakash |
| 7,023,013 B2 | 4/2006 | Ricks et al. |
| 7,189,989 B2 | 3/2007 | Ise |
| 7,235,420 B2 | 6/2007 | Prakash et al. |
| 7,540,978 B2 | 6/2009 | Pfeiffer et al. |
| 7,887,933 B2 | 2/2011 | Kathirgamanathan et al. |
| 8,063,399 B2 | 11/2011 | Johansson et al. |
| 8,343,381 B1 | 1/2013 | Chesterfield |
| 2001/0026878 A1 | 10/2001 | Woo et al. |
| 2002/0155319 A1 | 10/2002 | Kawamura et al. |
| 2004/0004433 A1 | 1/2004 | Lamansky et al. |
| 2004/0038459 A1 | 2/2004 | Brown et al. |
| 2004/0082250 A1 | 4/2004 | Haoto |
| 2004/0102577 A1 | 5/2004 | Hsu et al. |
| 2004/0127637 A1 | 7/2004 | Hsu et al. |
| 2004/0263067 A1 | 12/2004 | Saitoh et al. |
| 2005/0073249 A1 | 4/2005 | Morii et al. |
| 2005/0184287 A1 | 8/2005 | Herron et al. |
| 2005/0186106 A1 | 8/2005 | Li et al. |
| 2005/0191776 A1 | 9/2005 | Lamansky et al. |
| 2005/0205860 A1 | 9/2005 | Hsu et al. |
| 2006/0033421 A1 | 2/2006 | Matsuura et al. |
| 2006/0216411 A1 | 9/2006 | Steudel et al. |
| 2007/0031588 A1 | 2/2007 | Nakayama |
| 2007/0032632 A1 | 2/2007 | Tsukioka et al. |
| 2007/0079927 A1 | 4/2007 | Lamansky et al. |
| 2007/0096082 A1 | 5/2007 | Gaynor et al. |
| 2007/0181874 A1 | 8/2007 | Prakash et al. |
| 2007/0228364 A1 | 10/2007 | Radu et al. |
| 2008/0071049 A1 | 3/2008 | Radu et al. |
| 2008/0097076 A1 | 4/2008 | Radu et al. |
| 2008/0102312 A1 | 5/2008 | Parham et al. |
| 2008/0138655 A1 | 6/2008 | Lecloux et al. |
| 2009/0051281 A1 | 2/2009 | Inoue |
| 2009/0184635 A1 | 7/2009 | Pan et al. |

| | | | |
|---|---|---|---|
| 2009/0206748 A1 | 8/2009 | Moriwaki et al. | |
| 2010/0108989 A1 | 5/2010 | Büsing et al. | |
| 2010/0187506 A1 | 7/2010 | Park et al. | |
| 2011/0095269 A1 | 4/2011 | Zhang et al. | |

FOREIGN PATENT DOCUMENTS

| | | | |
|---|---|---|---|
| EP | 1277824 A1 | 1/2003 | |
| EP | 1624500 A1 | 2/2006 | |
| EP | 1933603 A1 | 6/2008 | |
| JP | 08167479 A | 6/1996 | |
| JP | 11224779 A | 8/1999 | |
| JP | 11338172 A | 12/1999 | |
| JP | 2000068073 A | 3/2000 | |
| JP | 2000186066 A | 7/2000 | |
| JP | 2001039933 A | 2/2001 | |
| JP | 2001226331 A | 8/2001 | |
| JP | 2002506481 A | 2/2002 | |
| JP | 2002293888 A | 10/2002 | |
| JP | 2003026641 A | 1/2003 | |
| JP | 2003238501 A | 8/2003 | |
| JP | 2004014187 A | 1/2004 | |
| JP | 2004107292 A | 4/2004 | |
| JP | 2006328037 A | 12/2006 | |
| JP | 2007182432 A | 7/2007 | |
| KR | 1020050073233 A | 7/2005 | |
| KR | 100702763 B1 | 4/2007 | |
| KR | 1020070091293 A | 9/2007 | |
| KR | 100765728 B1 | 10/2007 | |
| WO | 9954385 A1 | 10/1999 | |
| WO | 0053565 A1 | 9/2000 | |
| WO | 2004041901 A1 | 5/2004 | |
| WO | 2005049546 A1 | 6/2005 | |
| WO | 2005049548 A1 | 6/2005 | |
| WO | 2005049689 A2 | 6/2005 | |
| WO | 2005052027 A1 | 6/2005 | |
| WO | WO2005/049689 | * | 6/2005 |
| WO | 2006063852 A1 | 6/2006 | |
| WO | 2007076146 A2 | 7/2007 | |
| WO | 2008011953 A1 | 1/2008 | |
| WO | 2009067419 A1 | 5/2009 | |

OTHER PUBLICATIONS

Chen et al—Efficient, Blue Light-Emitting Diodes Using Cross-Linked Layers of Polymeric Arylamine and Fluorene, Synthetic Metals 107, 1999, pp. 129-135.
Colon et al—High Molecular Weight Aromatic Polymers by Nickel Coupling of Aryl Polychlorides; Journal of Polymer Science, Part A, Polymer Chemistry Edition, 1990, vol. 28: 367.
Eaton et al—Dihedral Angle of Biphenyl in Solution and the Molecular Force Field; J. Chem. Soc. Faraday Trans. 2, 1973, 60, pp. 1601-1608.
Gustafsson et al.—Flexible Light-Emitting Diodes Made From Soluble Conducting Polymers, 1992 vol. 357, pp. 477-479.
He et al—A Hole-Transporting Material With Controllable Morphology Containing Binaphthyl and Triphenylamine Chromophores; Advanced Functional Materials, vol. 16, No. 10, 2006, pp. 1343-1348.
He et al—High-Efficiency Organic Polymer Light-Emitting Heterostructure Devices on Flexible Plastic Substates, 2000, Applied Physics Letters, vol. 76, No. 6, pp. 661-663.
He et al., "High-efficiency Organic Polymer Light-emitting Heterostructure Devices on Flexible Plastic Substrates," Feb. 2000; American Institute of Physics, Chem Abstract 132: 229208.
Kawamura—Aromatic Oligoamine Derivatives, Their Hole Injection-Transporting Materials, and Their Organic EL Devices With Low Driving Voltage, 2003, 673842.
Nakatsuka et al., "Organic Field-effect Electroluminescent Devices with Long Lifetime," 1999, Mitsui Chemicals Inc., Japan, Chem Abstract 131: 191677.
Nakatsuka et al., "Preparation of 2,7-bis[(bisdiarylamino)aryl] fluorine Derivatives as Hole-transport Materials for Organic Electroluminescent Devices," 2001, Mitsui Chemicals Inc., Japan, Chem Abstract 134: 172027.
Shimamura—New Amine Compound for Organic Electroluminescent Device Showing Longer Luminescent Lifetime and Excellent Durability, Chemical Abstracts, 2001, 603530.
Wang—Photoconductive Materials, Kirk-Othmer Encyclopedia of Chemical Technology, Fourth Edition, 1996, vol. 18, pp. 837-860.
Yamamoto et al, Electrically conducting and thermally stable pi-conjugated poly(arylene)s prepared by organometallic process, Progress in Polymer Science, vol. 17, pp. 1153-1205, 1992.
Zhu et al., "Effect of ITO Carrier Concentration on the Performance of Light-Emitting Diodes," 2000; Material Research Society; Chem Abstract 134: 122994.
PCT International Search Report for International Application No. PCT/US2007/018530, C. Meiners Authorized Officer, Feb. 7, 2008.
PCT International Search Report for International Application No. PCT/US2007/018531, D. Marsitzky Authorized Officer, Feb. 26, 2008.
Borello et al., "Photodetectors," Kirk-Othmer Encyclopedia of Chemical Technology, Fourth Edition, 1999, vol. 18, pp. 1537-1538.
Lee et al., "A Thermally Stable Hole Injection Material for Use in Organic Light-Emitting Diodes," Thin Solid Films, 2007, vol. 515, pp. 7726-7731.
Noji et al., "A New Catalytic System for Aerobic Oxidative Coupling of 2-Naphthol Derivatives by the Use of CuCl-Amine Complex: A Practical Synthesis of Binaphthol Derivatives," Tetrahedron Letters, 1994, vol. 35, No. 43, pp. 7983-7984.
Zhao et al., "Solid-State Dye-Sensitized Photovoltaic Device with Newly Designed Small Organic Molecule as Hole-Conductor," Chemical Physical Letters, 2007, vol. 445, pp. 259-264.

* cited by examiner

*Primary Examiner* — Duc Truong

(57) ABSTRACT

There is provided a polymer made from a monomer having Formula I:

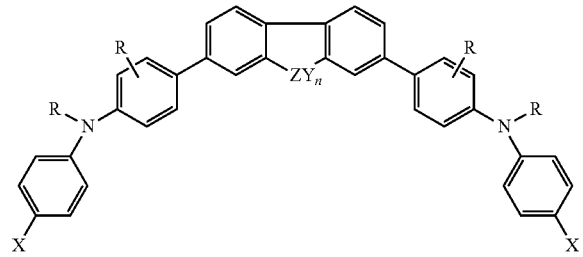

Formula I where:
R and Y are independently selected from the group consisting of H, D, alkyl, fluoroalkyl, aryl, fluoroaryl, alkoxy, aryloxy, NR"2, R', R' is a crosslinkable group;

R'' is independently selected from the group consisting of H, alkyl, fluoroalkyl, aryl, fluoroaryl, and R';

X is a leaving group;

Z is C, Si, or N;

Q is $(ZR''_n)_b$;

a is an integer from 0 to 5;

b is an integer from 0 to 20;

c is an integer from 0 to 4;

q is an integer from 0 to 7; and n is an integer from 1 to 2.

3 Claims, 1 Drawing Sheet

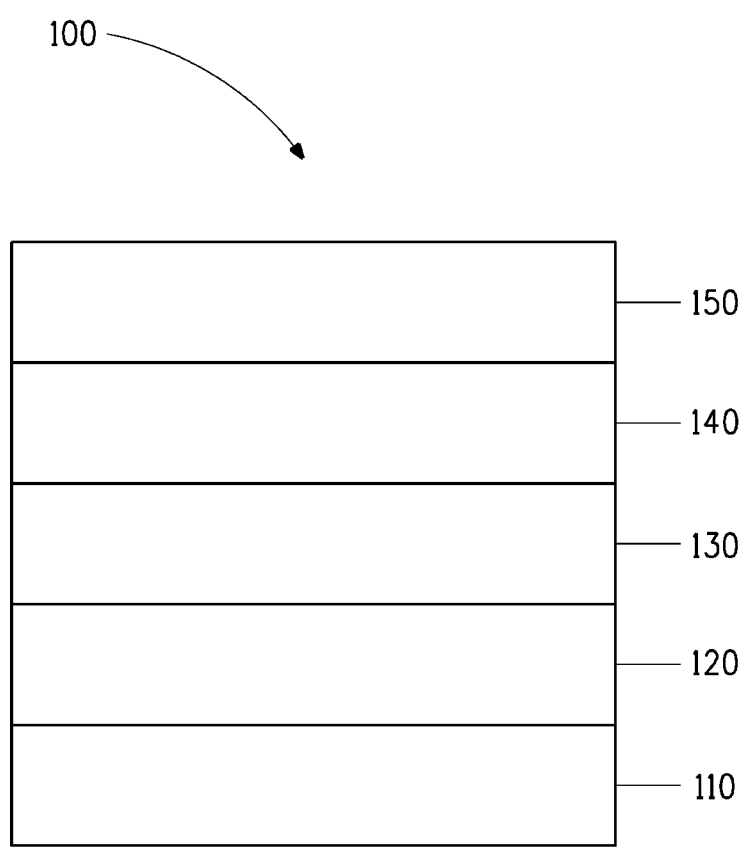

HOLE TRANSPORT POLYMERS

RELATED APPLICATION DATA

This application claims priority under 35 U.S.C. §120 from U.S. patent application Ser. No. 13/843,029, filed Aug. 22, 2007 now U.S. Pat. No. 8,252,223 (incorporated by reference herein in its entirety), which in turn claimed priority under 35 U.S.C. §119(e) from U.S. Provisional Application No. 60/839,915 filed on Aug. 24, 2006, which is incorporated by reference herein in its entirety.

BACKGROUND INFORMATION

1. Field of the Disclosure

The present invention relates to novel compounds useful as hole transport materials in making electronic devices. The invention further relates to electronic devices having at least one active layer comprising such a hole transport compound.

2. Description of the Related Art

In organic photoactive electronic devices, such as organic light emitting diodes ("OLED"), that make up OLED displays, the organic active layer is sandwiched between two electrical contact layers in an OLED display. In an OLED the organic photoactive layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used. Devices that use photoactive materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for charge transport materials for use in electronic devices.

SUMMARY

There is provided a polymer made from at least one monomer having Formula I:

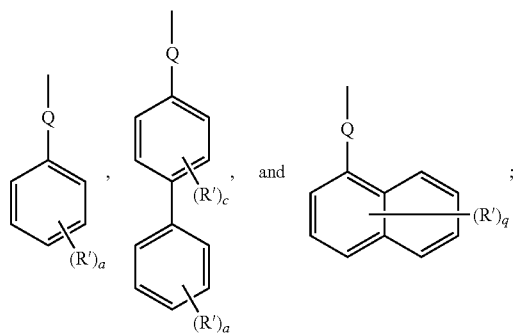

where:
R and Y are independently selected from the group consisting of H, D, alkyl, fluoroalkyl, aryl, fluoroaryl, alkoxy, aryloxy, NR"2, R',

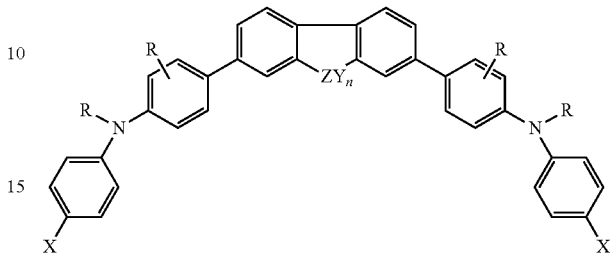

Formula I

R' is a crosslinkable group;
R" is independently selected from the group consisting of H, alkyl, fluoroalkyl, aryl, fluoroaryl, and R';
X can be the same or different at each occurrence and is a leaving group;
Z is C, Si, or N;
Q is $(ZR''_n)_b$;
a is an integer from 0 to 5;
b is an integer from 0 to 20;
c is an integer from 0 to 4; and
q is an integer from 0 to 7.
n is an integer from 1 to 2

There is also provided a polymer comprising at least one copolymer made from a monomer having Formula I and at least one comonomer selected from the group consisting of Formulae II through VIII:

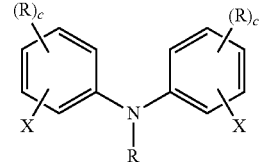

Formula II

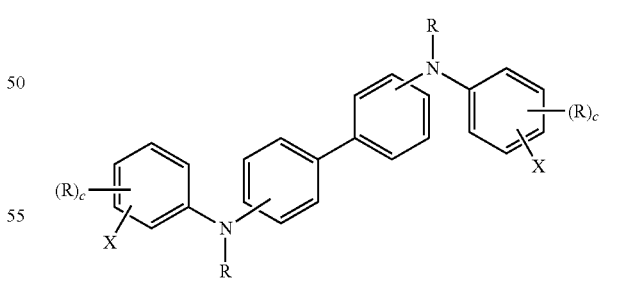

Formula III

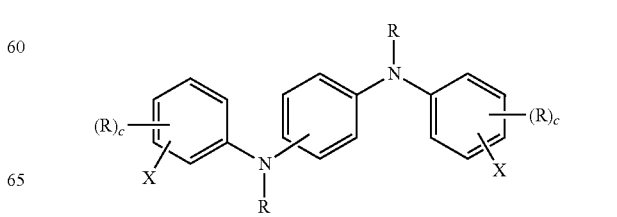

Formula IV

Formula V

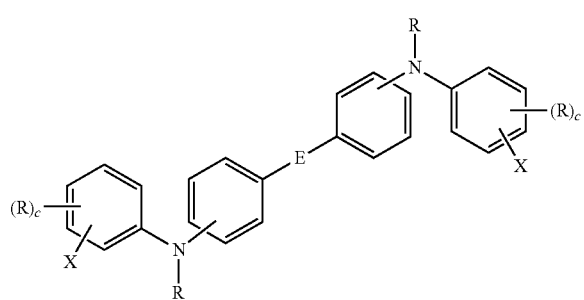

Formula VI

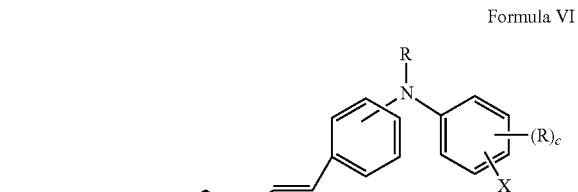

Formula VII

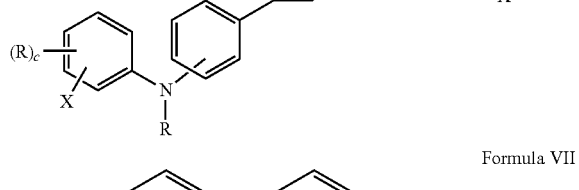

Formula VIII

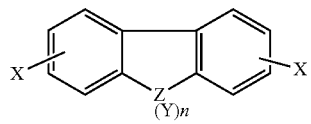

where:
R and Y are independently selected from the group consisting of H, D, alkyl, fluoroalkyl, aryl, fluoroaryl, alkoxy, aryloxy, $NR''_2$, R',

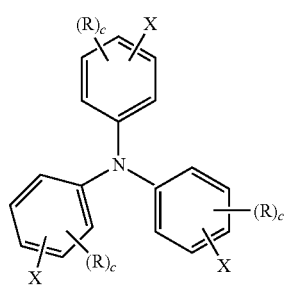

R' is a crosslinkable group;
R" is independently selected from the group consisting of H, alkyl, fluoroalkyl, aryl, fluoroaryl, and R';
Q is $(ZR''_n)_b$;

X can be the same or different at each occurrence and is a leaving group;
Z is C, Si, or N;
E is $(ZR''_n)_b$, O, S, Se, or Te;
a is an integer from 0 to 5;
b is an integer from 0 to 20;
c is an integer from 0 to 4;
q is an integer from 0 to 7, and
n is an integer from 1 to 2.

There is also provided an electronic device made with the polymer or copolymer.

There is also provided a semiconductor made with the polymer or copolymer.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 1 includes as illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are disclosed herein and are exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Monomer, the Polymers, the Electronic Device, and finally Examples.

1. Definitions and Clarification of Terms

Before addressing details of embodiments described below, some terms are defined or clarified.

As used herein, the term "alkyl" includes both branched and straight-chain saturated aliphatic hydrocarbon groups. Unless otherwise indicated, the term is also intended to include cyclic groups. Examples of alkyl groups include methyl, ethyl, propyl, isopropyl, isobutyl, secbutyl, tertbutyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and trisubstituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms.

The term "aryl" means an aromatic carbocyclic moiety of up to 30 carbon atoms, which may be a single ring (monocyclic) or multiple rings (bicyclic, up to three rings) fused together or linked covalently. Any suitable ring position of the aryl moiety may be covalently linked to the defined chemical structure. Examples of aryl moieties include, but are not limited to, phenyl, 1-naphthyl, 2-naphthyl, dihydronaphthyl, tetrahydronaphthyl, biphenyl, anthryl, phenanthryl, fluorenyl, indanyl, biphenylenyl, acenaphthenyl, acenaphthylenyl, and the like. In some embodiments, aryl groups have 6 to 30 carbon atoms. The term is intended to include heteroaryl groups. Heteroaryl groups may have from 4-30 carbon atoms.

The term "alkoxy" is intended to mean the group —OR, where R is alkyl.

The term "aryloxy" is intended to mean the group —OR, where R is aryl.

Unless otherwise indicated, all groups can be substituted or unsubstituted.

An optionally substituted group, such as, but not limited to, alkyl or aryl, may be substituted with one or more substituents which may be the same or different. Suitable substituents include alkyl, aryl, nitro, cyano, —N($R^7$)($R^8$), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, thioalkoxy, —S(O)$_2$—N(R')(R"), —C(=O)—N(R')(R"), (R')(R")N-alkyl, (R')(R")N-alkoxyalkyl, (R')(R")N-alkylaryloxyalkyl, —S(O)$_s$-aryl (where s=0-2) or —S(O)$_s$-heteroaryl (where s=0-2). Each R' and R" is independently an optionally substituted alkyl, cycloalkyl, or aryl group. R' and R", together with the nitrogen atom to which they are bound, can form a ring system in certain embodiments.

The prefix "hetero" indicates that one or more carbon atoms has been replaced with a different atom. In some embodiments, the heteroatom is O, N, S, or combinations thereof.

The prefix "fluoro" is intended to indicate that one or more hydrogens in a group has been replaced with fluorine.

The term "photoactive" is intended to mean to any material that exhibits electroluminescence or photosensitivity.

The term "polymer" is intended to include oligomers, homopolymers, and copolymers having two or more different repeating units. A polymer having repeating units derived from a monomer "X-T-X" will have repeating units —(T). "Polymer" may therefore also include polymers comprising comonomers of the same backbone but with different substituent groups.

The term "crosslinkable group" is intended to mean a group than can lead to crosslinking via thermal treatment or exposure to UV or visible radiation.

The term "leaving group" is intended to mean a group that facilitates polymerization and is eliminated in the polymerization reaction. In one embodiment, the leaving group is a halide or boronic ester or boronic acid or triflate, where triflate is trifluoromethanesulfonate.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond).

The term "compound" is intended to mean an electrically uncharged substance made up of molecules that further consist of atoms, wherein the atoms cannot be separated by physical means.

In addition, the IUPAC numbering system is used throughout, (CRC Handbook of Chemistry and Physics, 81$^{st}$ Edition, 2000).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the CRC Handbook of Chemistry and Physics, 81$^{st}$ Edition (2000-2001), where the groups are numbered from left to right as 1 through 18.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

Some details regarding specific materials, processing acts, and circuits are conventional and may be found in textbooks and other sources within the organic light-emitting diode display, photodetector, photovoltaic, and semiconductive member arts and therefore need not be presented herein for a fully enabling disclosure.

2. Monomer

The monomer having Formula I

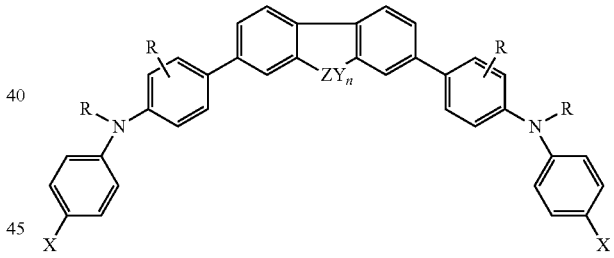

Formula I has a central fluorenyl group (or the silyl or the carbazole analog) with arylamine end groups.

In one embodiment, Y is alkyl. In one embodiment, the alkyl groups have from 1-10 carbon atoms.

In one embodiment, R is aryl. In one embodiment, R is phenyl.

The X group is the leaving group that is eliminated in the polymerization reaction. Any effective leaving group can be used, including chloride, bromide, and triflate leaving groups. In one embodiment, X=Br.

3. Polymers

Homopolymers of monomers having Formula I can be made by Yamamoto polymerization. In this synthetic method, as described in Yamamoto, Progress in Polymer Science, Vol. 17, p 1153 (1992), the monomers having two leaving groups are reacted with a stoichiometric amount of a zerovalent nickel compound, such as bis(1,5-cyclooctadiene)nickel(0). Such homopolymers will have exclusively arylamine end groups.

In one embodiment, the homopolymer has Formula IX:

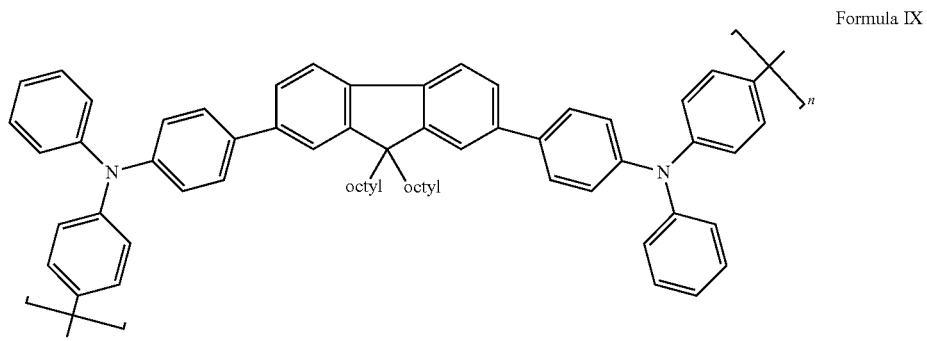

Formula IX

This polymer is different from one made by the copolymerization of

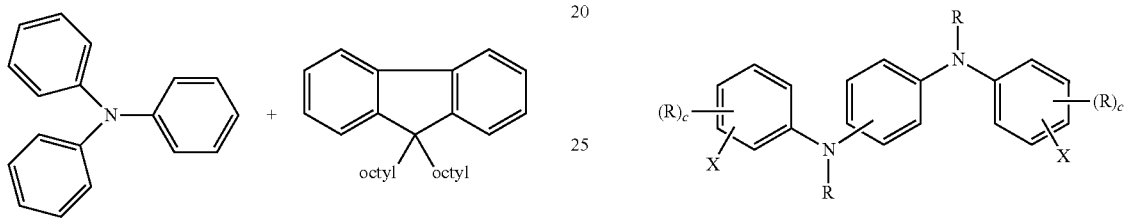

by Suzuki coupling (as described in U.S. Pat. No. 5,962,631, and published PCT application WO 00/53565). The Suzuki polymer will have some fluorene end groups, whereas the homopolymer of Formula VIII will only have triarylamine end groups.

In some embodiment, the monomer having Formula I is reacted with one or more comonomers to form a copolymer. In one embodiment, the copolymer is formed by Yamamoto polymerization. Surprisingly, it has been found that in some embodiments, the copolymers of monomers with Formula I that are formed by Yamamoto polymerization have improved properties in electronic devices. In some embodiments, electronic devices made with the Yamamoto copolymers, exhibit longer lifetimes.

In some embodiments, copolymers are made from comonomers having Formulae II through VII:

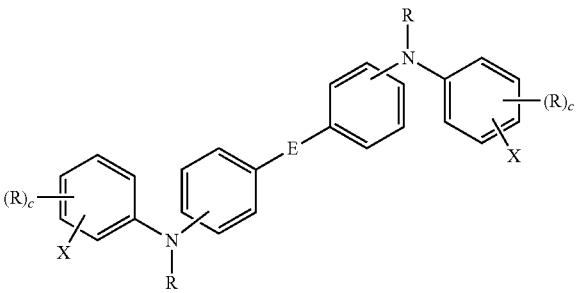

Formula II

Formula III

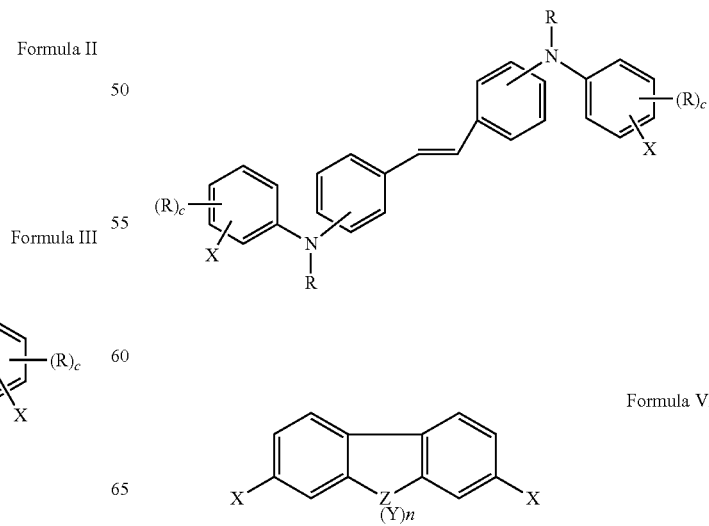

Formula IV

Formula V

Formula VI

Formula VII

-continued

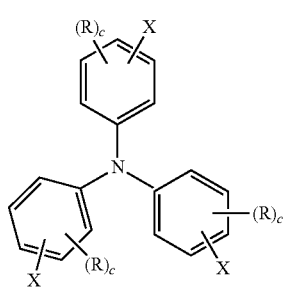

Formula VIII where:

R and Y are independently selected from the group consisting of H, D, alkyl, fluoroalkyl, aryl, fluoroaryl, alkoxy, aryloxy, NR"$_2$, R',

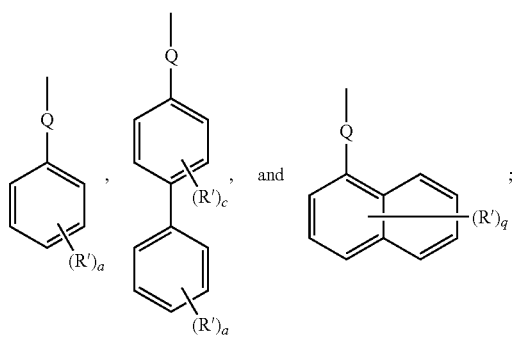

R' is a crosslinkable group;

R" is independently selected from the group consisting of H, alkyl, fluoroalkyl, aryl, fluoroaryl, and R';

Q is $(ZR''_n)_b$;

X is a leaving group;

Z is C, Si, or N;

E is $(ZR''_n)_b$, O, S, Se, or Te;

a is an integer from 0 to 5;

b is an integer from 0 to 20;

c is an integer from 0 to 4;

q is an integer from 0 to 7, and n is an integer from 1 to 2.

When R' is present, the copolymer will be crosslinkable. The copolymer can be formed into a film and then crosslinked by exposure to heat and/or radiation to form a more robust, less soluble film. In some embodiments, the uncrosslinked polymer is soluble in solvents for film forming, and the crosslinked film is not soluble and thus is undisturbed by solvents used in later processing steps.

Examples of R' groups include, but are not limited to vinyl, acrylate, perfluorovinylether, 1-benzo-3,4-cyclobutane, siloxane, and methyl esters. In one embodiment, R' is vinyl.

In one embodiment, the copolymer has a formula selected from Formulae X through XII:

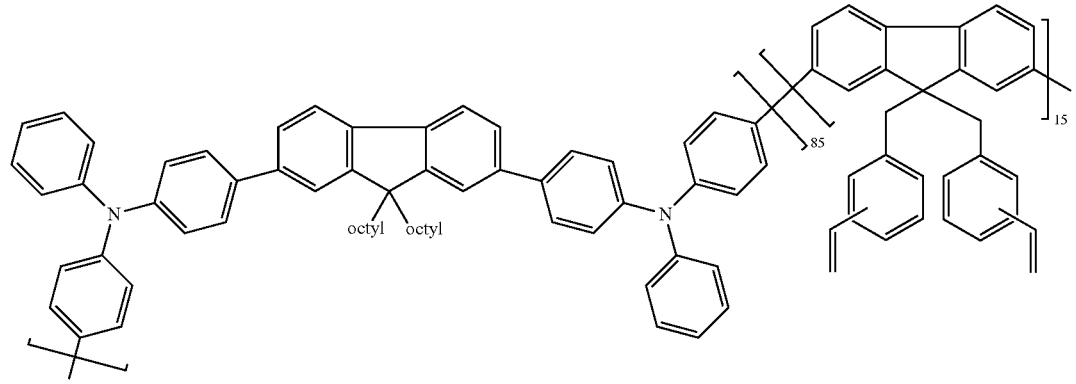

Formula X

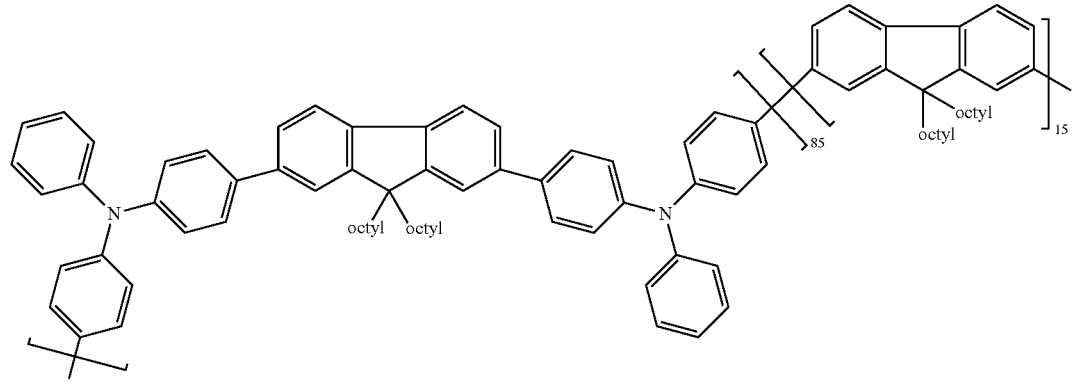

Formula XI

Formula XII

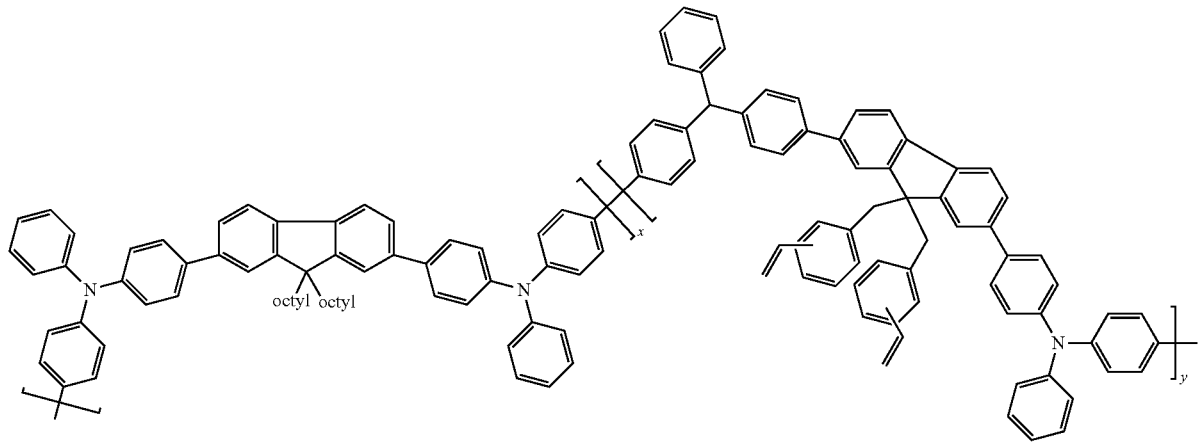

4. Electronic Devices

Organic electronic devices that may benefit from having one or more layers comprising at least one compound as described herein include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

One illustration of an organic electronic device structure is shown in FIG. 1. The device 100 has an anode layer 110 and a cathode layer 150, and a photoactive layer 130 between them. Adjacent to the anode is a layer 120 comprising a charge transport layer, for example, a hole transport material. Adjacent to the cathode may be a charge transport layer 140 comprising an electron transport material. As an option, devices may use one or more additional hole injection or hole transport layers (not shown) next to the anode 110 and/or one or more additional electron injection or electron transport layers (not shown) next to the cathode 150.

As used herein, the term "photoactive" refers to a material that emits light when activated by an applied voltage (such as in a light-emitting diode or light-emitting electrochemical cell), or responds to radiant energy and generates a signal with or without an applied bias voltage (such as in a photodetector). In one embodiment, a photoactive layer is an emitter layer.

As used herein, the term "charge transport," when referring to a layer or material is intended to mean such layer or material facilitates migration of such charge through the thickness of such layer, material, member, or structure with relative efficiency and small loss of charge, and is meant to be broad enough to include materials that may act as a hole transport or an electron transport material. The term "electron transport" when referring to a layer or material means such a layer or material, member or structure that promotes or facilitates migration of electrons through such a layer or material into another layer, material, member or structure.

Depending upon the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are described in Kirk-Othmer Concise Encyclopedia of Chemical Technology, 4$^{th}$ edition, p. 1537, (1999).

In some embodiments, the hole transport layer 120 comprises at least one new polymer as described herein. In some embodiments, the device further comprises a buffer layer between the anode and the layer comprising the new polymer. The term "buffer layer" is intended to mean a layer comprising electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions.

In some embodiment, the device further comprises an additional hole transport layer between the photoactive layer and the layer comprising the new polymer.

In some embodiments, the photoactive layer comprises at least one photoactive material and at least one new polymer as described herein. The new polymer functions as a host for the photoactive material.

The other layers in the device can be made of any materials which are known to be useful in such layers. The anode 110, is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8 10 transition metals. If the anode is to be light-transmitting, mixed-metal oxides of Groups 12, 13 and 14 metals, such as indium-tin-oxide, are generally used. The anode 110 may also comprise an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

The hole transport layer, which is a layer that facilitates the migration of negative charges through the layer into another layer of the electronic device, can include any number of materials. Examples of other hole transport materials for layer 120 have been summarized for example, in Kirk Othmer Encyclopedia of Chemical Technology, Fourth Edition, Vol. 18, p. 837 860, 1996, by Y. Wang. Both hole transporting molecules and polymers can be used. Commonly used hole transporting molecules include, but are not limited to: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis (3-methylphenyl)-N,N,N',N'-2,5-phenylenediamine (PDA), a-phenyl 4-N,N-diphenylaminostyrene (TPS), p-(diethylamino)benzaldehyde diphenylhydrazone (DEH), triphenylamine (TPA), bis[4 (N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N',N' tetrakis(4-methylphenyl)-(1,1'-biphenyl)-4,4'-diamine (TTB), N,N'-Bis(naphthalen-1-yl)-N,N'-bis-(phenyl)benzidine (α-NPB), and porphyrinic compounds, such as copper phthalocyanine. Commonly used hole transporting polymers include, but are not limited to, polyvinylcarbazole, (phenylmethyl)polysilane, and polyaniline. It is also possible to obtain hole transporting polymers by doping hole transporting molecules such as those mentioned above into polymers such as polystyrene and polycarbonate. Buffer layers and/or hole transport layer can also comprise polymers of thiophene, aniline, or pyrrole with polymeric fluorinated sulfonic acids, as described in published US applications 2004/102577, 2004/127637, and 2005/205860.

Any organic electroluminescent ("EL") material can be used as the photoactive material in layer 130. Such materials include, but are not limited to, one of more compounds of the instant invention, small organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, and mixtures thereof. Examples of conjugated polymers include, but are not limited to poly(phenylenevinylenes), polyfluorenes, poly (spirobifluorenes), polythiophenes, poly(p-phenylenes), copolymers thereof, and mixtures thereof. The materials may also be present in admixture with a host material. In some embodiments, the host material is a hole transport material or an electron transport material.

Examples of electron transport materials which can be used in the electron transport layer 140 and/or the optional layer between layer 140 and the cathode, include metal chelated oxinoid compounds, such as tris(8-hydroxyquinolato) aluminum (Alq3) and tetrakis-(8-hydroxyquinolato)zirconium (Zrq4); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof.

The cathode 150, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, and Li$_2$O can also be deposited between the organic layer and the cathode layer to lower the operating voltage.

The choice of materials for each of the component layers is preferably determined by balancing the goals of providing a device with high device efficiency with device operational lifetime.

The device can be prepared by a variety of techniques, including sequentially depositing the individual layers on a suitable substrate. Substrates such as glass and polymeric films can be used. Conventional vapor deposition techniques can be used, such as thermal evaporation, chemical vapor deposition, and the like. Alternatively, the organic layers can be applied by liquid deposition using suitable solvents. The liquid can be in the form of solutions, dispersions, or emulsions. Typical liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing, any conventional coating or printing technique, including but not limited to spin-coating, dip-coating, roll-to-roll techniques, ink jet printing, screen-printing, gravure printing and the like.

The new polymers described herein can be applied by liquid deposition from a liquid composition. The term "liquid composition" is intended to mean a liquid medium in which a material is dissolved to form a solution, a liquid medium in which a material is dispersed to form a dispersion, or a liquid medium in which a material is suspended to form a suspension or an emulsion.

In one embodiment, the different layers have the following range of thicknesses: anode 110, 500-5000 Å, in one embodiment 1000-2000 Å; hole transport layer 120, 50-2000 Å, in one embodiment 200-1000 Å; photoactive layer 130, 10-2000 Å, in one embodiment 100-1000 Å; layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In one embodiment, the device has the following structure, in order: anode, buffer layer, hole transport layer, photoactive layer, electron transport layer, electron injection layer, cathode. In one embodiment, the anode is made of indium tin oxide or indium zinc oxide. In one embodiment, the buffer layer comprises a conducting polymer selected from the group consisting of polythiophenes, polyanilines, polypyrroles, copolymers thereof, and mixtures thereof. In one embodiment, the buffer layer comprises a complex of a conducting polymer and a colloid-forming polymeric acid. In one embodiment, the buffer layer comprises a compound having triarylamine or triarylmethane groups. In one embodiment, the buffer layer comprises a material selected from the group consisting of TPD, MPMP, NPB, CBP, and mixtures thereof, as defined above.

In one embodiment, the hole transport layer comprises polymeric hole transport material. In one embodiment, the hole transport layer is crosslinkable. In one embodiment, the hole transport layer comprises a compound having triarylamine or triarylmethane groups. In one embodiment, the buffer layer comprises a material selected from the group consisting of TPD, MPMP, NPB, CBP, and mixtures thereof, as defined above.

In one embodiment, the photoactive layer comprises an electroluminescent material and a host material. The host can be a charge transport material. In one embodiment, the electroluminescent material is present in an amount of at least 1% by weight. In one embodiment, the electroluminescent material is 2-20% by weight. In one embodiment, the electroluminescent material is 20-50% by weight. In one embodiment, the electroluminescent material is 50-80% by weight. In one embodiment, the electroluminescent material is 80-99% by weight. In one embodiment, the electroluminescent material is metal complex. In one embodiment, the metal complex is a cyclometalated complex of iridium, platinum, rhenium, or osmium. In one embodiment, the photoactive layer further comprises a second host material. The second host can be a charge transport material. In one embodiment, the second host is a hole transport material. In one embodiment, the second host is an electron transport material. In one embodiment, the second host material is a metal complex of a hydroxyaryl-N-heterocycle. In one embodiment, the hydroxyaryl-N-heterocycle is unsubstituted or substituted 8-hydroxyquinoline. In one embodiment, the metal is aluminum. In one embodiment, the second host is a material selected from the group consisting of tris(8-hydroxyquinolinato)aluminum, bis(8-hydroxyquinolinato)(4-phenylphenolato)aluminum, tetrakis(8-hydroxyquinolinato)zirconium, and mixtures thereof. The ratio of the first host to the second host can be 1:100 to 100:1. In one embodiment the ratio is from 1:10 to 10:1. In one embodiment, the ratio is from 1:10 to 1:5. In one embodiment, the ratio is from 1:5 to 1:1. In one embodiment, the ratio is from 1:1 to 5:1. In one embodiment, the ratio is from 5:1 to 5:10.

In one embodiment, the electron transport layer comprises a metal complex of a hydroxyaryl-N-heterocycle. In one embodiment, the hydroxyaryl-N-heterocycle is unsubstituted or substituted 8-hydroxyquinoline. In one embodiment, the metal is aluminum. In one embodiment, the electron transport layer comprises a material selected from the group consisting of tris(8-hydroxyquinolinato)aluminum, bis(8-hydroxyquinolinato)(4-phenylphenolato)aluminum, tetrakis(8-hydroxyquinolinato)zirconium, and mixtures thereof. In one embodiment, the electron injection layer is LiF or $LiO_2$. In one embodiment, the cathode is Al or Ba/Al.

In one embodiment, the device is fabricated by liquid deposition of the buffer layer, the hole transport layer, and the photoactive layer, and by vapor deposition of the electron transport layer, the electron injection layer, and the cathode.

The buffer layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is selected from the group consisting of alcohols, ketones, cyclic ethers, and polyols. In one embodiment, the organic liquid is selected from dimethylacetamide ("DMAc"), N-methylpyrrolidone ("NMP"), dimethylformamide ("DMF"), ethylene glycol ("EG"), aliphatic alcohols, and mixtures thereof. The buffer material can be present in the liquid medium in an amount from 0.5 to 10 percent by weight. Other weight percentages of buffer material may be used depending upon the liquid medium. The buffer layer can be applied by any continuous or discontinuous liquid deposition technique. In one embodiment, the buffer layer is applied by spin coating. In one embodiment, the buffer layer is applied by ink jet printing. After liquid deposition, the liquid medium can be removed in air, in an inert atmosphere, or by vacuum, at room temperature or with heating. In one embodiment, the layer is heated to a temperature less than 275° C. In one embodiment, the heating temperature is between 100° C. and 275° C. In one embodiment, the heating temperature is between 100° C. and 120° C. In one embodiment, the heating temperature is between 120° C. and 140° C. In one embodiment, the heating temperature is between 140° C. and 160° C. In one embodiment, the heating temperature is between 160° C. and 180° C. In one embodiment, the heating temperature is between 180° C. and 200° C. In one embodiment, the heating temperature is between 200° C. and 220° C. In one embodiment, the heating temperature is between 190° C. and 220° C. In one embodiment, the heating temperature is between 220° C. and 240° C. In one embodiment, the heating temperature is between 240° C. and 260° C. In one embodiment, the heating temperature is between 260° C. and 275° C. The heating time is dependent upon the temperature, and is generally between 5 and 60 minutes. In one embodiment, the final layer thickness is between 5 and 200 nm. In one embodiment, the final layer thickness is between 5 and 40 nm. In one embodiment, the final layer thickness is between 40 and 80 nm. In one embodiment, the final layer thickness is between 80 and 120 nm. In one embodiment, the final layer thickness is between 120 and 160 nm. In one embodiment, the final layer thickness is between 160 and 200 nm.

The hole transport layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic liquid is selected from chloroform, dichloromethane, toluene, anisole, and mixtures thereof. The hole transport material can be present in the liquid medium in a concentration of 0.2 to 2 percent by weight. Other weight percentages of hole transport material may be used depending upon the liquid medium. The hole transport layer can be applied by any continuous or discontinuous liquid deposition technique. In one embodiment, the hole transport layer is applied by spin coating. In one embodiment, the hole transport layer is applied by ink jet printing. After liquid deposition, the liquid medium can be removed in air, in an inert atmosphere, or by vacuum, at room temperature or with heating. In one embodiment, the layer is heated to a temperature of 300° C. or less. In one embodiment, the heating temperature is between 170° C. and 275° C. In one embodiment, the heating temperature is between 170° C. and 200° C. In one embodiment, the heating temperature is between 190° C. and 220° C. In one embodiment, the heating temperature is between 210° C. and 240° C. In one embodiment, the heating temperature is between 230° C. and 270° C. The heating time is dependent upon the temperature, and is generally between 5 and 60 minutes. In one embodiment, the final layer thickness is between 5 and 50 nm. In one embodiment, the final layer thickness is between 5 and 15 nm. In one embodiment, the final layer thickness is between 15 and 25 nm. In one embodiment, the final layer thickness is between 25 and 35 nm. In one embodiment, the final layer thickness is between 35 and 50 nm.

The photoactive layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic liquid is selected from chloroform, dichloromethane, toluene, anisole, and mixtures thereof. The photoactive material can be present in the liquid medium in a concentration of 0.2 to 2 percent by weight. Other weight percentages of photoactive material may be used depending upon the liquid medium. The photoactive layer can be applied by any continuous or discontinuous liquid deposition technique. In one embodiment, the photoactive layer is applied by spin coating. In one embodiment, the photoactive layer is applied by ink jet printing. After liquid deposition, the liquid medium can be removed in air, in an inert atmosphere, or by vacuum, at room temperature or with heating. In one embodiment, the deposited layer is heated to a temperature that is less than the Tg of the material having the lowest Tg. In one embodiment, the heating temperature is at least 10° C. less than the lowest Tg. In one embodiment, the heating temperature is at least 20° C. less than the lowest Tg. In one embodiment, the heating temperature is at least 30° C. less than the lowest Tg. In one embodiment, the heating temperature is between 50° C. and 150° C. In one embodiment, the heating temperature is between 50° C. and 75° C. In one embodiment, the heating temperature is between 75° C. and 100° C. In one embodiment, the heating temperature is between 100° C. and 125° C. In one embodiment, the heating temperature is between 125° C. and 150° C. The heating time is dependent upon the temperature, and is generally between 5 and 60 minutes. In one embodiment, the final layer thickness is between 25 and 100 nm. In one embodiment, the final layer thickness is between 25 and 40 nm. In one embodiment, the final layer thickness is between 40 and 65 nm. In one embodiment, the final layer thickness is between 65 and 80 nm. In one embodiment, the final layer thickness is between 80 and 100 nm.

The electron transport layer can be deposited by any vapor deposition method. In one embodiment, it is deposited by thermal evaporation under vacuum. In one embodiment, the final layer thickness is between 1 and 100 nm. In one embodiment, the final layer thickness is between 1 and 15 nm. In one embodiment, the final layer thickness is between 15 and 30 nm. In one embodiment, the final layer thickness is between 30 and 45 nm. In one embodiment, the final layer thickness is between 45 and 60 nm. In one embodiment, the final layer thickness is between 60 and 75 nm. In one embodiment, the final layer thickness is between 75 and 90 nm. In one embodiment, the final layer thickness is between 90 and 100 nm.

The electron injection layer can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. All vapor deposition rates given herein are in units of Angstroms per second. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 0.1 and 3 nm. In one embodiment, the final layer thickness is between 0.1 and 1 nm. In one embodiment, the final layer thickness is between 1 and 2 nm. In one embodiment, the final layer thickness is between 2 and 3 nm.

The cathode can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 10 and 10000 nm. In one embodiment, the final layer thickness is between 10 and 1000 nm. In one embodiment, the final layer thickness is between 10 and 50 nm. In one embodiment, the final layer thickness is between 50 and 100 nm. In one embodiment, the final layer thickness is between 100 and 200 nm. In one embodiment, the final layer thickness is between 200 and 300 nm. In one embodiment, the final layer thickness is between 300 and 400 nm. In one embodiment, the final layer thickness is between 400 and 500 nm. In one embodiment, the final layer thickness is between 500 and 600 nm. In one embodiment, the final layer thickness is between 600 and 700 nm. In one embodiment, the final layer thickness is between 700 and 800 nm. In one embodiment, the final layer thickness is between 800 and 900 nm. In one embodiment, the final layer thickness is between 900 and 1000 nm. In one embodiment, the final layer thickness is between 1000 and 2000 nm. In one embodiment, the final layer thickness is between 2000 and 3000 nm. In one embodiment, the final layer thickness is between 3000 and 4000 nm. In one embodiment, the final layer thickness is between 4000 and 5000 nm. In one embodiment, the final layer thickness is between 5000 and 6000 nm. In one embodiment, the final layer thickness is between 6000 and 7000 nm. In one embodiment, the final layer thickness is between 7000 and 8000 nm. In one embodiment, the final layer thickness is between 8000 and 9000 nm. In one embodiment, the final layer thickness is between 9000 and 10000 nm.

In one embodiment, the device is fabricated by vapor deposition of the buffer layer, the hole transport layer, and the photoactive layer, the electron transport layer, the electron injection layer, and the cathode.

In one embodiment, the buffer layer is applied by vapor deposition. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. In one embodiment, the material is deposited at a rate of 0.5 to 10 Å /sec. In one embodiment, the material is deposited at a rate of 0.5 to 1 Å /sec. In one embodiment, the material is deposited at a rate of 1 to 2 Å /sec. In one embodiment, the material is deposited at a rate of 2 to 3 Å /sec. In one embodiment, the material is deposited at a rate of 3 to 4 Å /sec. In one embodiment, the material is deposited at a rate of 4 to 5 Å /sec. In one embodiment, the material is deposited at a rate of 5 to 6 Å /sec. In one embodiment, the material is deposited at a rate of 6 to 7 Å /sec. In one embodiment, the material is deposited at a rate of 7 to 8 Å /sec. In one embodiment, the material is deposited at a rate of 8 to 9 Å /sec. In one embodiment, the material is deposited at a rate of 9 to 10 Å /sec. In one embodiment, the final layer thickness is between 5 and 200 nm. In one embodiment, the final layer thickness is between 5 and 30 nm. In one embodiment, the final layer thickness is between 30 and 60 nm. In one embodiment, the final layer thickness is between 60 and 90 nm. In one embodiment, the final layer thickness is between 90 and 120 nm. In one embodiment, the final layer thickness is between 120 and 150 nm. In one embodiment, the final layer thickness is between 150 and 280 nm. In one embodiment, the final layer thickness is between 180 and 200 nm.

In one embodiment, the hole transport layer is applied by vapor deposition. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. In one embodiment, the material is deposited at a rate of 0.5 to 10 Å /sec. In one embodiment, the material is deposited at a rate of 0.5 to 1 Å /sec. In one embodiment, the material is deposited at a rate of 1 to 2 Å /sec. In one embodiment, the material is deposited at a rate of 2 to 3 Å /sec. In one embodiment, the material is deposited at a rate of 3 to 4 Å /sec. In one embodiment, the material is deposited at a rate of 4 to 5 Å /sec. In one embodiment, the material is deposited at a rate of 5 to 6 Å /sec. In one embodiment, the material is deposited at a rate of 6 to 7 Å /sec. In one embodiment, the material is deposited at a rate of 7 to 8 Å /sec. In one embodiment, the material is deposited at a rate of 8 to 9 Å /sec. In one embodiment, the material is deposited at a rate of 9 to 10 Å /sec. In one embodiment, the final layer thickness is between 5 and 200 nm. In one embodiment, the final layer thickness is between 5 and 30 nm. In one embodiment, the final layer thickness is between 30 and 60 nm. In one embodiment, the final layer thickness is between 60 and 90 nm. In one embodiment, the final layer thickness is between 90 and 120 nm. In one embodiment, the final layer thickness is between 120 and 150 nm. In one embodiment, the final layer thickness is between 150 and 280 nm. In one embodiment, the final layer thickness is between 180 and 200 nm.

In one embodiment, the photoactive layer is applied by vapor deposition. In one embodiment, it is deposited by thermal evaporation under vacuum. In one embodiment, the photoactive layer consists essentially of a single electroluminescent compound, which is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. In one embodiment, the material is deposited at a rate of 0.5 to 10 Å /sec. In one embodiment, the material is deposited at a rate of 0.5 to 1 Å /sec. In one embodiment, the material is deposited at a rate of 1 to 2 Å /sec. In one embodiment, the material is deposited at a rate of 2 to 3 Å /sec. In one embodiment, the material is deposited at a rate of 3 to 4 Å /sec. In one embodiment, the material is deposited at a rate of 4 to 5 Å /sec. In one embodiment, the material is deposited at a rate of 5 to 6 Å /sec. In one embodiment, the material is deposited at a rate of 6 to 7 Å /sec. In one embodiment, the material is deposited at a rate of 7 to 8 Å /sec. In one embodiment, the material is deposited at a rate of 8 to 9 Å /sec. In one embodiment, the material is deposited at a rate of 9 to 10 Å /sec. In one embodiment, the final layer thickness is between 5 and 200 nm. In one embodiment, the final layer thickness is between 5 and 30 nm. In one embodiment, the final layer thickness is between 30 and 60 nm. In one embodiment, the final layer thickness is between 60 and 90 nm. In one embodiment, the final layer thickness is between 90 and 120 nm. In one embodiment, the final layer thickness is between 120 and 150 nm. In one embodiment, the final layer thickness is between 150 and 280 nm. In one embodiment, the final layer thickness is between 180 and 200 nm.

In one embodiment, the photoactive layer comprises two electroluminescent materials, each of which is applied by thermal evaporation under vacuum. Any of the above listed vacuum conditions and temperatures can be used. Any of the above listed deposition rates can be used. The relative deposition rates can be from 50:1 to 1:50. In one embodiment, the relative deposition rates are from 1:1 to 1:3. In one embodiment, the relative deposition rates are from 1:3 to 1:5. In one embodiment, the relative deposition rates are from 1:5 to 1:8. In one embodiment, the relative deposition rates are from 1:8 to 1:10. In one embodiment, the relative deposition rates are from 1:10 to 1:20. In one embodiment, the relative deposition rates are from 1:20 to 1:30. In one embodiment, the relative deposition rates are from 1:30 to 1:50. The total thickness of the layer can be the same as that described above for a single-component photoactive layer.

In one embodiment, the photoactive layer comprises one electroluminescent material and at least one host material, each of which is applied by thermal evaporation under vacuum. Any of the above listed vacuum conditions and temperatures can be used. Any of the above listed deposition rates can be used. The relative deposition rate of electroluminescent material to host can be from 1:1 to 1:99. In one embodiment, the relative deposition rates are from 1:1 to 1:3. In one embodiment, the relative deposition rates are from 1:3 to 1:5. In one embodiment, the relative deposition rates are from 1:5 to 1:8. In one embodiment, the relative deposition rates are from 1:8 to 1:10. In one embodiment, the relative deposition rates are from 1:10 to 1:20. In one embodiment, the relative deposition rates are from 1:20 to 1:30. In one embodiment, the relative deposition rates are from 1:30 to 1:40. In one embodiment, the relative deposition rates are from 1:40 to 1:50. In one embodiment, the relative deposition rates are from 1:50 to 1:60. In one embodiment, the relative deposition rates are from 1:60 to 1:70. In one embodiment, the relative deposition rates are from 1:70 to 1:80. In one embodiment, the relative deposition rates are from 1:80 to 1:90. In one embodiment, the relative deposition rates are from 1:90 to 1:99. The total thickness of the layer can be the same as that described above for a single-component photoactive layer.

In one embodiment, the electron transport layer is applied by vapor deposition. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 5 and 200 nm. In one embodiment, the final layer thickness is between 5 and 30 nm. In one embodiment, the final layer thickness is between 30 and 60 nm. In one embodiment, the final layer thickness is between 60 and 90 nm. In one embodiment, the final layer thickness is between 90 and 120 nm. In one embodiment, the final layer thickness is between 120 and 150 nm. In one embodiment, the final layer thickness is between 150 and 280 nm. In one embodiment, the final layer thickness is between 180 and 200 nm.

In one embodiment, the electron injection layer is applied by vapor deposition, as described above.

In one embodiment, the cathode is applied by vapor deposition, as describe above.

In one embodiment, the device is fabricated by vapor deposition of some of the organic layers, and liquid deposition of some of the organic layers. In one embodiment, the device is fabricated by liquid deposition of the buffer layer, and vapor deposition of all of the other layers Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

Example 1

Example 1 demonstrates the preparation of a monomer having Formula I, shown as Compound 5 below.

Synthesis of Compound 2

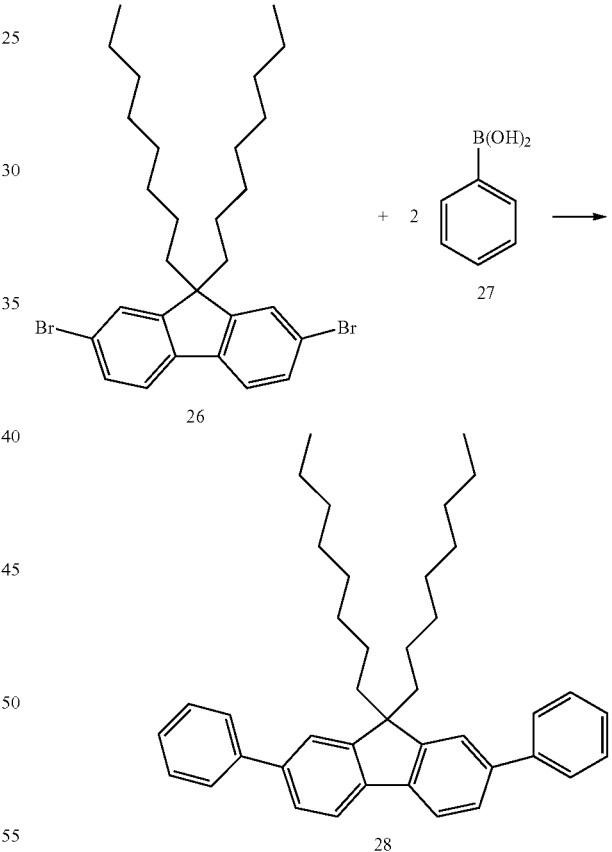

Under an atmosphere of nitrogen, a 250 mL round bottom was charged with 9,9-dioctyl-2,7-dibromofluorene (25.0 g, 45.58 mmol), phenylboronic acid (12.23 g, 100.28 mmol), Pd$_2$(dba)$_3$ (0.42 g, 0.46 mmol), P$^t$Bu$_3$ (0.22 g, 1.09 mmol) and 100 mL toluene. The reaction mixture stirred for five minutes after which KF (8.74 g, 150.43 mmol) was added in two portions and the resulting solution was stirred at room temperature overnight. The mixture was diluted with 500 mL THF and filtered through a plug of silica and celite and the volatiles were removed from the filtrate under reduced pressure. The yellow oil was purified by flash column chromatography on silica gel using hexanes as eluent. The product was obtained as a white solid in 80.0% (19.8 g). Analysis by NMR indicated the material to be compound 2 having structure given above.

Synthesis of compound 3

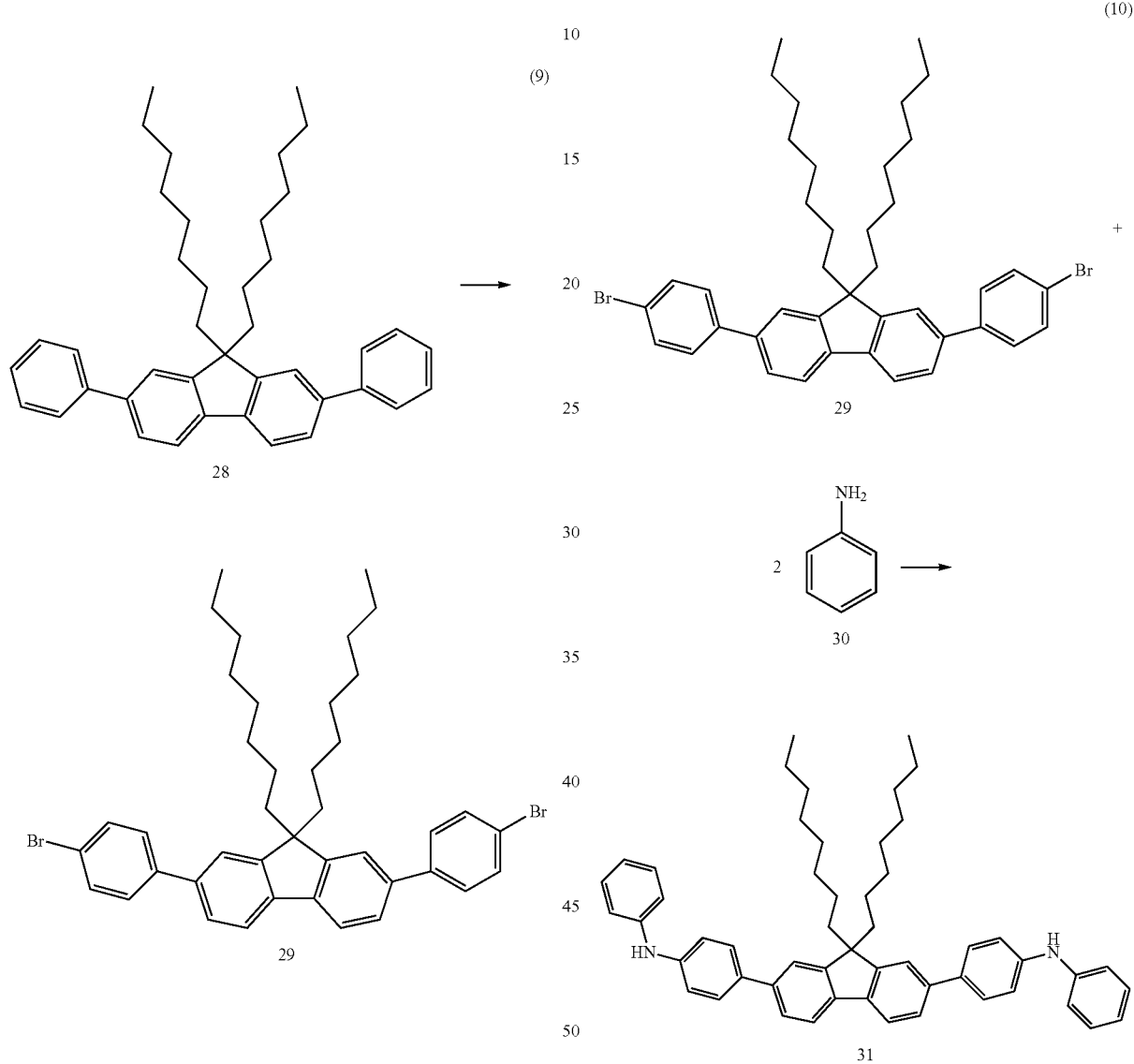

A 250 mL three-necked-round-bottom-flask, equipped with a condenser and dripping funnel was flushed with N₂ for 30 minutes. 9,9-dioctyl-2,7-diphenylfluorene (19.8 g, 36.48 mmol) was added and dissolved in 100 mL dichloromethane. The clear solution was cooled to −10° C. and a solution of bromine (12.24 g, 76.60 mmol) in 20 mL dichloromethane was added dropwise. The mixture was stirred for one hour at 0° C. and then allowed to warm to room temperature and stirred overnight. 100 mL of an aqueous 10% Na₂S₂O₃ solution was added and the reaction mixture was stirred for one hour. The organic layer was extracted and the water layer was washed three times with 100 mL dichloromethane. The combined organic layers were dried with Na₂SO₄ filtered and concentrated to dryness. Addition of acetone to the resulting oil gave a white precipitated. Upon filtration and drying a white powder was obtained (13.3 g, 52.2%). Analysis by NMR indicated the material to be compound 3 having structure given above.

Synthesis of compound 4

Under an atmosphere of nitrogen, a 250 mL round bottom was charged with 3 (13.1 g, 18.70 mmol), aniline (3.66 g, 39.27 mmol), Pd₂(dba)₃ (0.34 g, 0.37 mmol), P$^t$Bu₃ (0.15 g, 0.75 mmol) and 100 mL toluene. The reaction mixture stirred for 10 min after which NaO$^t$Bu (3.68 g, 38.33 mmol) was added and the reaction mixture was stirred at room temperature for one day. The resulting reaction mixture was diluted with 3 L toluene and filtered through a plug of silica and celite. Upon evaporation of volatiles, the dark brown oil obtained was purified by flash column chromatography on silica gel using a mixture of 1:10 ethyl acetate:hexanes as eluent. The product was obtained as a pale yellow powder in 50.2% (6.8 g). Analysis by NMR indicated the material to be compound 4 having structure given above.

Synthesis of compound 5

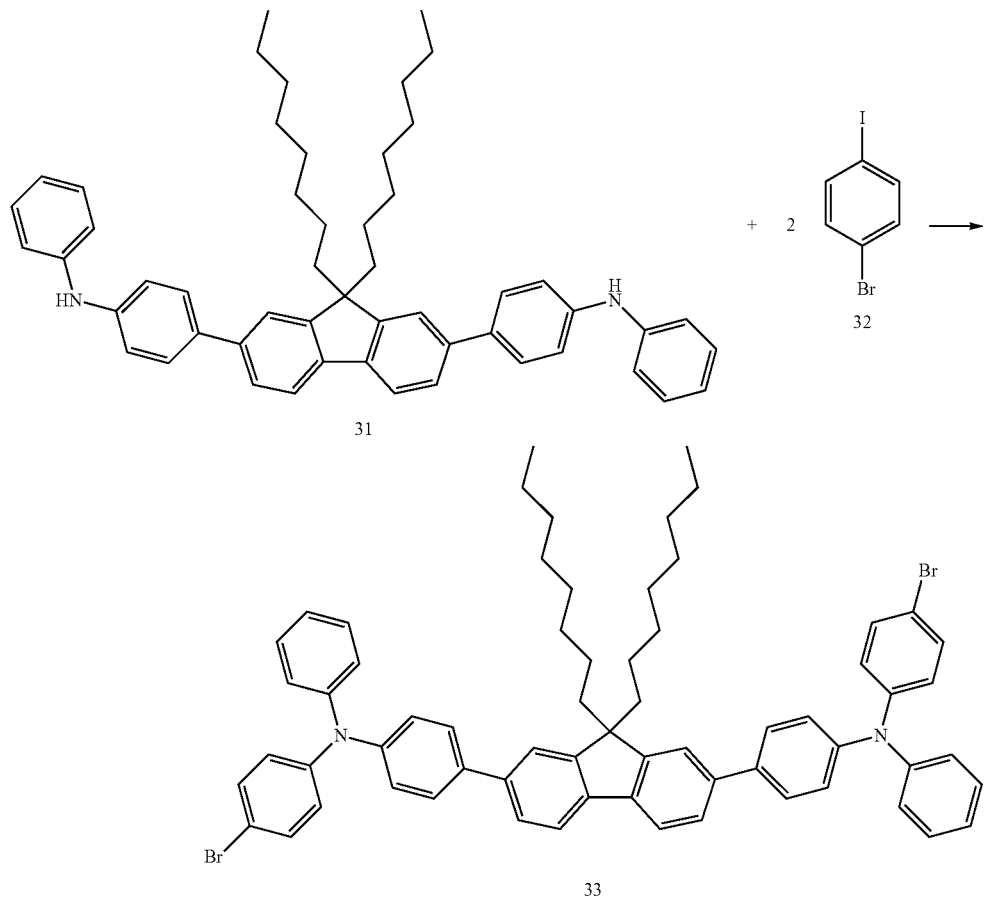

In a 250 mL three-necked-round-bottom-flask equipped with condenser, 4 (4.00 g, 5.52 mmol), 1-bromo-4-iodobenzene (4.68 g, 16.55 mmol), Pd$_2$(dba)$_3$ (0.30 g, 0.33 mmol) and DPPF (0.37 g, 0.66 mmol) were combined with 80 mL toluene. The resultant mixture was stirred for 10 min. NaO$^t$Bu (1.17 g, 12.14 mmol) was added and the mixture was heated to 80° C. for four days. The resulting reaction mixture was diluted with 1 L toluene and 1 L THF filtered through a plug of silica and celite to remove the insoluble salts. Upon evaporation of volatiles, the resulting brown oil was purified by flash column chromatography on silica gel using a mixture of 1:10 dichloromethane:hexanes as eluent. After drying a yellow powder was obtained (4.8 g, 84.8%). Analysis by NMR indicated the material to be compound 5 having structure given above.

Example 2

Example 2 demonstrates the preparation of a copolymer of the monomer from Example 1 and a fluorene monomer having reactive styryl groups using Yamamoto polymerization.

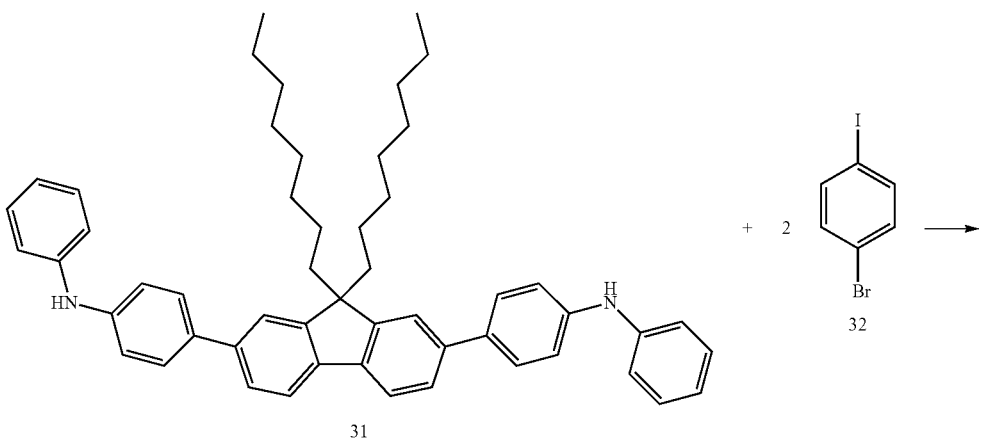

-continued

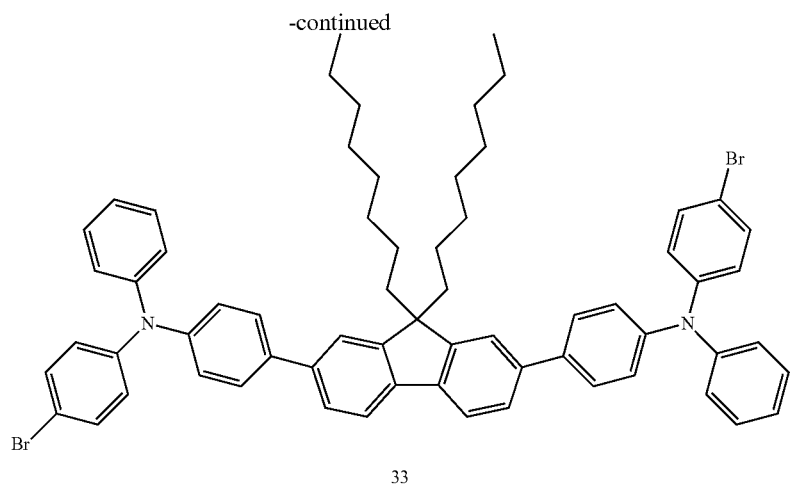

33

Bis(1,5-Cyclooctadiene)-nickel-(0) (0.556 g, 2.02 mmol) was added to a N,N-dimethylformamide (anhydrous, 4 mL) solution 2,2'-bipyridyl (0.0315 g, 2.02 mmol) and 1,5-cyclooctadiene (0.219 g, 2.02 mmol). The resulting mixture was heated to 60 C for 30 min. A toluene (anhydrous, 16 mL) solution of 2,7-dibromo-9,9'-(p-vinylbenzyl)-fluorene (0.0834 g, 0.15 mmol) and compound 5 (0.88 g, 0.85 mmol), was then added rapidly to the stirring catalyst mixture. The mixture was stirred at 60 C for seven hours. After the reaction mixture cooled to room temperature, it was poured, slowly, with vigorous stirring into 250 mL methanol and stirred overnight. Addition of 15 mL of conc. HCl followed and stirring for an hour. The precipitate was filtered and then added to 50 mL of toluene and poured slowly into 500 mL of methanol. The resulting light-yellow precipitate was stirred for one hour and then isolated by filtration. The solid was further purified by chromatography (silica, toluene) and precipitation from ethyl acetate. After drying the resulting material under vacuum a light yellow polymer was isolated in 80% yield (0.64 g). GPC (THF, room temperature): Mn=80,147; Mw=262,659; Mw/Mn=2.98.

Example 3

This example illustrates the preparation of a homopolymer of the monomer from Example 1 using Yamamoto polymerization. 7

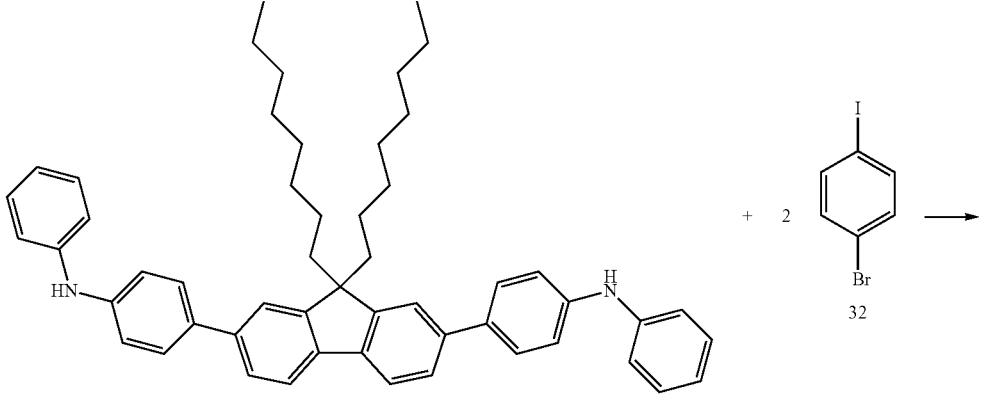

(11)

-continued

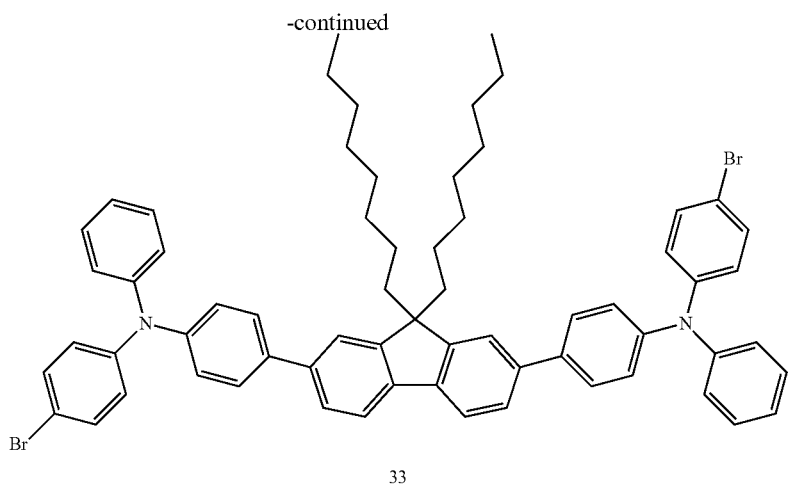

33

Bis(1,5-Cyclooctadiene)-nickel-(0) (0.833 g, 3.03 mmol) was added to a N,N-dimethylformamide (anhydrous, 6 mL) solution 2,2'-bipyridyl (0.473 g, 3.03 mmol) and 1,5-cyclooctadiene (0.328 g, 3.03 mmol). The resulting mixture was heated to 60 C for 30 min. A toluene (anhydrous, 24 mL) solution compound 5 (1.553 g, 1.50 mmol), was then added rapidly to the stirring catalyst mixture. The mixture was stirred at 60 C for seven hours. After the reaction mixture cooled to room temperature, it was poured, slowly, with vigorous stirring into 250 mL methanol and stirred overnight. Addition of 15 mL of conc. HCl followed and stirring for an hour. The precipitate was filtered and then added to 50 mL of toluene and poured slowly into 500 mL of methanol. The resulting light-yellow precipitate was stirred for one hour and then isolated by filtration. The solid was further purified by chromatography (silica, toluene) and precipitation from ethyl acetate. After drying the resulting material under vacuum a light yellow polymer was isolated in 82% yield (1.08 g). GPC (THF, room temperature): Mn=148,427; Mw=477,886; Mw/Mn=3.25.

Comparative Example A

This comparative example demonstrates the preparation of a copolymer of a fluorene having distyryl groups and a triarylamine using Suzuki polymerization. A monomer having Formula I was not used.

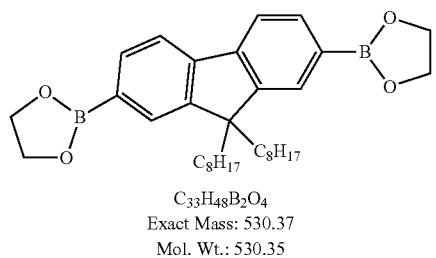

$C_{33}H_{48}B_2O_4$
Exact Mass: 530.37
Mol. Wt.: 530.35

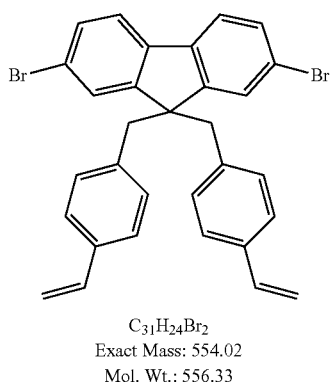

$C_{31}H_{24}Br_2$
Exact Mass: 554.02
Mol. Wt.: 556.33

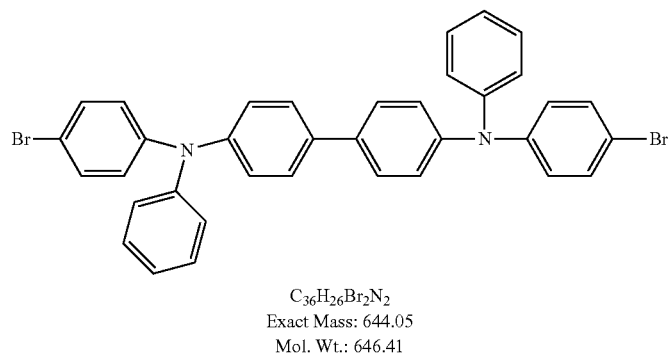

$C_{36}H_{26}Br_2N_2$
Exact Mass: 644.05
Mol. Wt.: 646.41

-continued

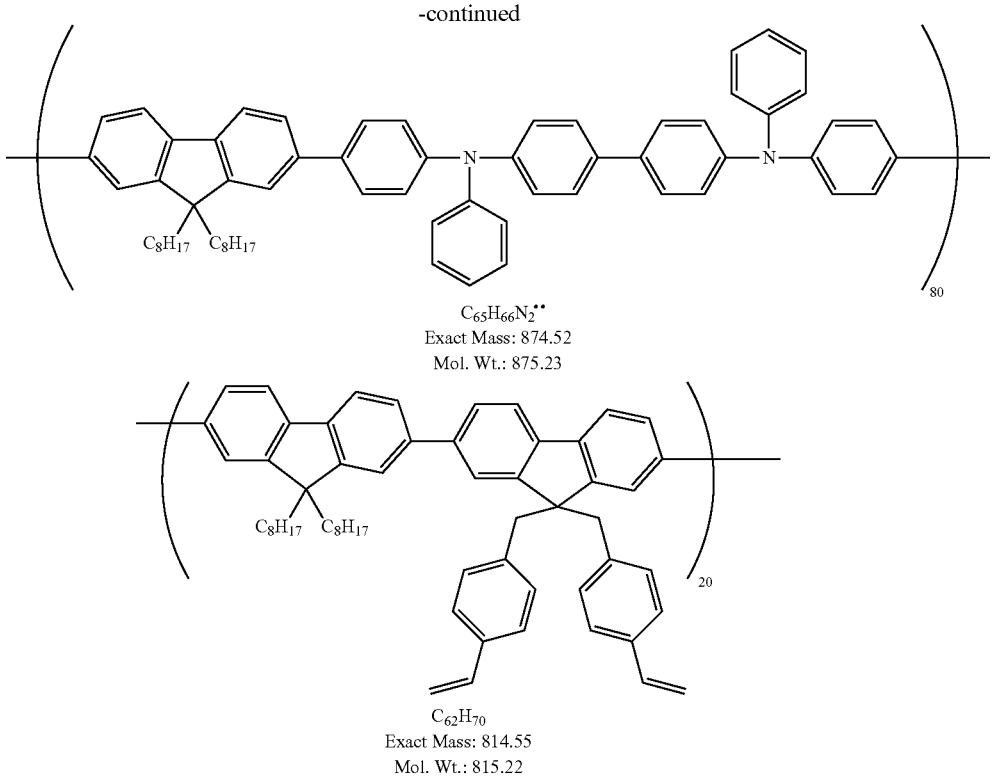

C₆₅H₆₆N₂··
Exact Mass: 874.52
Mol. Wt.: 875.23

C₆₂H₇₀
Exact Mass: 814.55
Mol. Wt.: 815.22

N,N-Di-(4-bromophenyl)-N,N-diphenyl benzidine (0.488 g, 0.754 mmol), 2,7-dibromo-9,9'-(p-vinylbenzyl)-fluorene (0.105 g, 0.189 mmol), 9,9-dioctyl fluorene-2,7-diethyleneboronate (0.500 g, 0.943 mmol) were mixed into a 50 mL 2-neck round bottom flask. A condenser with N₂ gas adapter were added followed by Aliquat 336 (0.209 g, 0.518 mmol) in toluene (11.0 mL). The resulting mixture was degassed at room temperature. After degassing, a 0.002M solution of tetrakis-triphenylphosphine palladium (0) in toluene (2.0 mL, 0.004 mmol) was injected and the solution further sparged for an additional 10 minutes. The solution was then heated to 95° C. using an oil-bath. A 2.0M sodium carbonate solution in water (2.8 mL, 5.657 mmol) was injected dropwise and the biphasic mixture vigorously stirred for 24 hours. Phenylboronic acid (0.092 g, 0.754 mmol) was added as a degassed slurry in toluene (3.0 mL). Then a 0.002M solution of tetrakis-triphenylphosphine palladium (0) in toluene (1.5 mL, 0.004 mmol) was injected and the reaction reheated to 95° C. overnight. After cooling, the aqueous and organic layers were separated and the organic layer was washed 1× with 20 mL of water. Sodium diethyldithiocarbamate (0.25 g, 1.109 mmol) in water (20 mL) was added to the organic layer. The biphasic mixture was vigorously stirred at 80° C. overnight. The aqueous and organic layers were separated and the organic layer washed with water (3×20 mL), then 1× with 5% HCl (20 mL) and finally with water (3×20 mL). The organic layer was diluted with toluene (30 mL) and filtered using a 1.5 cm (dia.)×8.0 cm (length) column loaded with Alumina-B (4 cm) layered on top of silica gel (4 cm). Toluene (90 mL) was used to elute the product. The pale yellow filtrate was precipitated from methanol by reducing its volume to about 30 mL and adding it dropwise to stirring methanol (300 mL) at room temperature. The dense pale yellow fibers were collected on a filter membrane (0.1 m Al₂O₃) and further dried under vacuum at room temperature for 1 hour. The fibers were then redissolved in a larger volume of toluene (60 mL), to produce less dense fibers, and added dropwise to stirring methanol (600 mL) at room temperature. The less dense fibers were collected on a filter membrane (0.1 m Al₂O₃) and dried under vacuum at room temperature for 24 hours. Isolated 0.708 g (87%) pale yellow fibers. GPC (THF, room temperature): Mn=42,067; Mw=172,727; Mw/Mn=4.10.

Example 4

This example demonstrates the performance of OLED devices made with hole transport polymer from Example 2 and with the hole transport polymer from Comparative Example A.

Patterned ITO substrates (device active area=2.24 mm×2.5 mm) were cleaned and cooled. A buffer layer at a thickness of about 180 nm was spin-coated over the ITO surface. The buffer material layer was an aqueous dispersion of polypyrrole and a perfluorinated polymer, as described in published U.S. patent application 2005-0205860. The substrates were then baked and transferred to a drybox, in which all further manipulations were conducted. The substrates were spin-coated with a 0.4% w/v solution of a hole-transport material in toluene to form a hole-transport layer, and then baked again.

The substrates were spin-coated with a 1.5% w/v toluene solution of a 13:1 w/w mixture of host:dopant supplied by Idemitsu Kosan Co. (Chiba, Japan) as listed in TABLE 1 to a thickness of 60-70 nm and baked at 105-130° C. for 30 min at atmospheric pressure.

The substrates were then masked and placed in a vacuum chamber. A layer of tetrakis(8-hydroxyquinoline)zirconium (ZrQ) was deposited by thermal evaporation to form an electron transport layer. This was followed by a layer of lithium fluoride. An overcoat of Al was vapor deposited, to form the cathode. The devices were encapsulated using a glass lid, getter pack, and UV curable epoxy.

The devices were then measured for initial current, voltage, luminance and color coordinate properties. Finally, the luminance degradation behavior was examined by subjecting the devices to constant current for a prolonged time period while monitoring luminance and voltage change. The resulting device performance data is listed in Table 1.

TABLE

| HTM | Curr. Eff'cy [cd/A] | Vlt. | Lum. [cd/m²] | CIE [x] | CIE [y] | Lum. ½ Life [h] | Life test Lum. [cd/m²] |
|---|---|---|---|---|---|---|---|
| Example 2 | 4.4 | 5.1 | 426 | 0.133 | 0.148 | 1100 projected | 2245 |
| Comparative Ex. A | 4.4 | 5.8 | 371 | 0.134 | 0.156 | 215 | 2093 |

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A polymer made from monomers having Formula I:

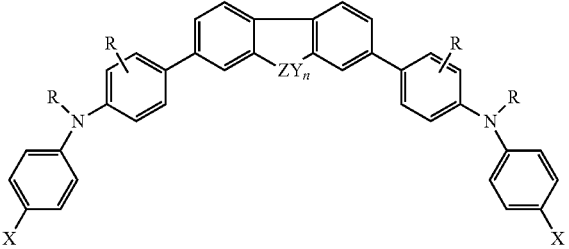

Formula I where:
R and Y are independently selected from the group consisting of H, D, alkyl,

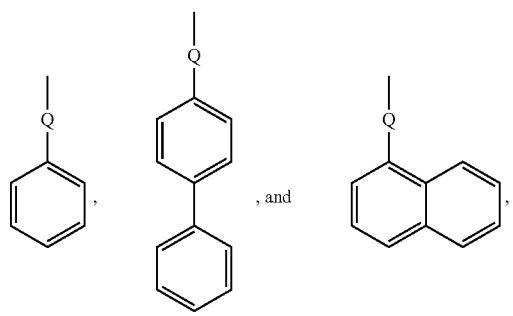

, and fluoroalkyl, aryl, fluoroaryl, alkoxy, aryloxy, and NR"$_2$;
R" is independently selected from the group consisting of H, alkyl, fluoroalkyl, aryl, and fluoroaryl;
X the same or different at each occurrence and is a leaving group;
Z is C, N, or Si;
Q is $(ZR''_n)_b$;
b is an integer from 0 to 20; and
n is an integer from 1 to 2.

2. A polymer of claim 1 which is a homopolymer.

3. The homopolymer of claim 2 made by Yamamoto polymerization.

* * * * *